United States Patent
Cirillo et al.

(10) Patent No.: US 11,256,781 B2
(45) Date of Patent: Feb. 22, 2022

(54) MEASUREMENT SYSTEM AS WELL AS METHOD OF PROVIDING STATISTICAL INFORMATION

(71) Applicant: Rohde & Schwarz GmbH & Co. KG, Munich (DE)

(72) Inventors: Luke Cirillo, Munich (DE); Prabaker Balasubramanium, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 373 days.

(21) Appl. No.: 16/280,961

(22) Filed: Feb. 20, 2019

(65) Prior Publication Data

US 2020/0265110 A1 Aug. 20, 2020

(51) Int. Cl.
| | | |
|---|---|---|
| *G06F 17/18* | (2006.01) | |
| *G06F 9/54* | (2006.01) | |
| *G01R 31/3183* | (2006.01) | |
| *G06N 7/00* | (2006.01) | |

(52) U.S. Cl.
CPC ..... *G06F 17/18* (2013.01); *G01R 31/318342* (2013.01); *G06F 9/542* (2013.01); *G06N 7/005* (2013.01)

(58) Field of Classification Search
CPC ......... G06F 17/18; G06F 9/542; G06N 7/005; G01R 31/318342
See application file for complete search history.

(56) References Cited

U.S. PATENT DOCUMENTS

| | | | | |
|---|---|---|---|---|
| 6,662,143 | B2 | 12/2003 | Sonoda | |
| 2002/0110376 | A1* | 8/2002 | MacLean | H04N 5/35563 396/429 |
| 2003/0037136 | A1* | 2/2003 | Labovitz | H04L 63/1425 709/224 |
| 2003/0095504 | A1* | 5/2003 | Ogier | H04L 69/167 370/235 |
| 2003/0135645 | A1* | 7/2003 | Oki | H04L 45/32 709/238 |
| 2003/0212604 | A1* | 11/2003 | Cullen, III | G06Q 30/02 705/26.35 |
| 2005/0082382 | A1* | 4/2005 | Evelyn-Veere | A01G 25/167 239/63 |
| 2007/0116235 | A1* | 5/2007 | Heinmiller | H04M 3/2218 379/221.08 |

(Continued)

*Primary Examiner* — Tuan C Dao
(74) *Attorney, Agent, or Firm* — Christensen O'Connor Johnson Kindness PLLC

(57) ABSTRACT

A measurement system includes a measurement module, a processing module, and a display. The measurement module is configured to conduct measurements on a device under test in a repetitive manner in order to obtain measurement results assigned to the repeated measurements. The processing module is configured to combine the measurement results obtained. The processing module is also configured to perform a statistical analysis in a live manner in order to calculate at least one of a live statistical significance parameter of the combined measurement results and a time duration required to obtain a certain statistical significance of the measurement results. The display is configured to display at least one of the live statistical significance parameter and the time duration. Further, a method of providing statistical information is described.

19 Claims, 1 Drawing Sheet

(56) References Cited

U.S. PATENT DOCUMENTS

| | | | |
|---|---|---|---|
| 2007/0229055 A1 | 10/2007 | Nishida | |
| 2011/0173068 A1* | 7/2011 | O'Hanlon | G06Q 30/0251 |
| | | | 705/14.52 |
| 2013/0060485 A1* | 3/2013 | Unger | B01D 46/446 |
| | | | 702/24 |
| 2013/0208945 A1* | 8/2013 | Nunn | G06K 9/00798 |
| | | | 382/103 |
| 2014/0214354 A1* | 7/2014 | Dreifus | G01R 31/2856 |
| | | | 702/117 |

* cited by examiner

MEASUREMENT SYSTEM AS WELL AS METHOD OF PROVIDING STATISTICAL INFORMATION

FIELD OF THE DISCLOSURE

Embodiments of the present disclosure relate generally to a measurement system. Further, embodiments of the present disclosure generally relate to a method of providing statistical information to a user of a measurement system.

BACKGROUND

In the state of the art, measurement systems are known that are used to conduct different measurements on a device under test in order to obtain measurement results with respect to a certain performance parameter that is of interest, for instance a phase difference between antennas of a multi-channel communication system or a radar system. The measurement results are used to evaluate the characteristics of the respective device under test. Generally, all measurement processes are affected by statistical variations. Therefore, no measured output value is constant as an averaging operation is typically applied over a certain period of time in order to reduce the variation of the measurement results obtained in order to provide a (statistically) reliable measured output value. However, a user of the measurement system does not know how good the averaged measured output value is in a statistical sense since the user does not gather any information with respect to the statistical accuracy of the measured output value.

In addition, the user is also not able to automate the process of measuring the device under test by setting the measurement time, namely the period of time used for the averaging operation, based on a desired level of statistical accuracy that shall be achieved or that is sufficient. In other words, users of the measurement systems known so far have to decide, based on their individual experience, whether or not the resulting measured output value obtained looks reliable or not in a statistical sense.

Accordingly, there is a need for a measurement system as well as a method that provide information to the user, particularly less-experienced user, that enables the user to evaluate the reliability of the measured output value.

SUMMARY

Embodiments of the present disclosure provide a measurement system comprising a measurement module, a processing module, and a display. The measurement module is configured to conduct measurements on a device under test in a repetitive manner in order to obtain measurement results assigned to the repeated measurements. The processing module is configured to combine (average) the measurement results obtained. The processing module is further configured to perform a statistical analysis in a live manner in order to calculate at least one of a live statistical significance parameter of the combined measurement results and a time duration required to obtain a certain statistical significance of the measurement results. The display is configured to display at least one of the live statistical significance parameter and the time duration.

Further, embodiments of the present disclosure provide a method of providing statistical information to a user of a measurement system, with the following steps:

Conducting measurements on a device under test in a repetitive manner in order to obtain measurement results assigned to the repeated measurements, Combining the measurement results obtained, Performing a statistical analysis in a live manner, Computing at least one of a live statistical significance parameter of the combined measurement results and a time duration required to obtain a certain statistical significance of the measurement results, and Displaying at least one of the live statistical significance parameter and the time duration.

Accordingly, the user is informed about the live statistical significance parameter and/or the time duration that is required to obtain the respective statistical significance of the measurement results since this information is displayed. In contrast thereto, measurement systems are known that may internally calculate a statistical significance parameter such as a standard deviation which, however, is only used for internal processing, particularly for defining testing conditions. Thus, the user does not retrieve any information with respect to the statistical significance of the measured output value that may relate to a mean value of the measurement results. The mean value may also be called average value of the measurement results.

In general, combing the measurement results obtained corresponds to averaging the measurement results. Averaging the measurement results, however, is not limited to calculating the mean of the measurement results obtained. In fact, combining or rather averaging the measurement results obtained may relate to any way of aggregating an overall measurement result from measurement results obtained from several repetitive measurements. For instance, combining or rather averaging the measurement results obtained may also result in the median of the several repetitive measurement results or any other way of combining the measurement results.

As the time duration required may be displayed, the user is also enabled to check how long the overall measurement, namely the several measurements or rather measurement cycles, will take to achieve the certain statistical significance of the measurement results, for instance a certain level of confidence. The level of confidence may correspond to a 99% confidence interval.

In other words, the measured output value can be evaluated on a statistical basis since the user knows that a certain performance requirement is met with the respective statistical significance, for instance a 99% confidence interval. Thus, a scientific basis is provided that can be used to check whether a certain design of the device under test meets the respective criteria or not.

The certain statistical significance may be pre-defined or rather set by the user manually which may depend on testing procedure(s). Thus, the certain statistical significance may correspond to a desired one. The measurement system may comprise a memory in which the certain statistical significance is stored.

Generally, the measurement system is, inter alia, used to provide measurement results with regard to a respective performance parameter of the device under test, for instance a phase difference between antennas of a radar system or a multi-channel communication system. Hence, the device under test may correspond to a multi-channel communication system or a radar system in the example given above. However, the device under test may correspond to any kind of system which performance or characteristics shall be tested.

Moreover, the minimum measurement time required to achieve the certain statistical significance, namely an acceptable statistical significance, can be determined in an automatic manner as the respective time duration is calculated by the processing module.

The processing module, inter alia, calculates statistical properties of the measurement results that may comprise the at least one live statistical significance parameter which can be displayed. In fact, the statistical properties calculated may be displayed if wanted, namely several live statistical significance parameters simultaneously.

The processing module is configured to calculate the live statistical significance parameter of the combined measurement results and/or the time duration required to obtain the certain statistical significance of the measurement results. Further, the display is configured to display the live statistical significance parameter and/or the time duration.

As mentioned above, the statistical significance parameter may correspond to a confidence interval. Moreover, the statistical significance parameter may be assigned to a standard deviation, a percentile, namely an n-th percentile, and/or a statistical probability distribution of the measurement results.

Generally, the live statistical significance parameters are assigned solely to the measurement results obtained. Put another way, statistical significance parameters, for instance standard deviations, are taken into account for the measurement system itself and the device under test, wherein the respective statistical significance parameters are separated from each other. Thus, the at least one live statistical significance parameter of the combined measurement results may be gathered by separating the statistical significance parameters for the device under test from the statistical significance parameters for the measurement system. Accordingly, the statistical significance parameters for the device under test correspond to the statistical significance parameters of the combined measurement results.

Put another way, knowledge about the measurement system is gathered and used to obtain the at least one statistical significance parameter of the combined measurement results. Thus, the influence of the measurement system itself is removed previously. In other words, the contribution of uncertainty due to the measurement system is removed previously so that the at least one statistical significance parameter of the combined measurement results can be obtained that is only assigned to the measurement results or rather the device under test.

Accordingly, the uncertainty related to the measurement system is known and taken into account appropriately.

The certain statistical significance may correspond to a threshold for the respective statistical significance parameter. Particularly, the statistical significance parameter calculated is compared with the certain statistical significance, for instance the threshold, in real time.

In fact, the certain statistical significance is assigned to the device under test, namely the measurement results obtained from the device under test. Thus, the contribution of uncertainty due to the measurement system itself may be removed previously so that the statistical significance of the measurements is calculated and (optionally) displayed. Accordingly, the measured output value assigned to the device under test is provided with a higher level of confidence on the measured output value.

According to an aspect, the measurement system comprises a user interface via which a user is enabled to make settings of the measurement system. The user may set the certain statistical significance that shall be achieved by the measurements. Hence, the user indirectly sets the measurement time as the measurement module conducts the measurements on the device under test until the certain statistical significance is achieved.

Furthermore, the user may select via the user interface one of several live statistical significance parameters that shall be calculated and/or displayed. For instance, the user might be more interested in the statistical probability distribution instead of the standard deviation. Accordingly, the user may select the statistical probability distribution as being the live statistical significance parameter that shall be calculated and/or displayed.

Therefore, the user interface corresponds to an input interface via which the user is enabled to make inputs.

Particularly, the user interface is configured to enable the user to set at least one of the certain statistical significance and a configurable measurement parameter. Thus, the user may set the certain statistical significance and/or the configurable measurement parameter. As mentioned above, the certain statistical significance may bet set so that the measurement module conducts the measurements for a time period until the certain statistical significance set is reached. For instance, a certain confidence interval may be set by the user. Moreover, the user may set the configurable measurement parameter such as a measurement time or rather an averaging time. By increasing the measurement or rather averaging time, the variance of the measured output value is reduced that is obtained by averaging or rather combining the measurement results.

In general, the configurable measurement parameter may be adjusted automatically or rather by the user. Hence, the automatic adjustment may be based on an input of the user. By adapting the configurable measurement parameter, confidence in the measurement results, particularly the measured output value, can be improved.

According to another aspect, the processing module is configured to calculate at least one of the live statistical significance parameter and the time duration while the measurements are conducted. Hence, the live statistical significance parameter and/or the time duration are/is calculated while the measurements are conducted. Put another way, the live statistical significance parameter and/or the time duration are/is calculated in real time.

Further, the display may be configured to display at least one of the live statistical significance parameter and the time duration while the measurements are conducted. Hence, the live statistical significance parameter and/or the time duration are/is displayed while the measurements are conducted. The information calculated by the processing module is processed by the display in order to inform the user about the statistical significance of the measured output value, namely the mean value. Thus, the user of the measurement system receives a direct feedback during the measurements.

The display may be configured to simultaneously display the live statistical significance parameter and a combined value, for instance an averaged value, of the measurement results. Hence, the live statistical significance parameter and the combined o rather averaged value of the measurement results are displayed simultaneously. Accordingly, the user is directly informed with respect to the statistical accuracy of the resulting measured output value, namely the average value of the measurement results.

In fact, the processing module continuously calculates the live statistical significance parameter and/or the time duration so that the information displayed is updated in a continuous manner. In other words, the user obtains a continuous feedback about the live statistical significance parameter, for instance the current level of statistical confidence in the combined value of the measurement results that is also displayed.

For instance, the confidence interval around the mean gets tighter as the measurement or rather averaging time increases.

According to another aspect, the display is configured to display a measurement value obtained from the current measurement conducted by the measurement module. Further, the measurement value obtained from the current measurement is displayed, in particular in addition to the combined value as well as the live statistical significance parameter assigned thereto. Thus, a current measurement value, namely the measurement value currently measured, may also be displayed for informing the user. The user retrieves more information about the reliability of the measured output value obtained from the combination, namely the averaging, of the measurement results.

Generally, the user gets more information about the device under test as the evaluation of the performance of the device under test comes along with an additional statistical analysis.

Another aspect provides that the processing module is configured to apply a statistical model for calculating at least one of the live statistical significance parameter and the time duration. The statistical model may relate to data obtained from the measurements conducted.

In fact, the statistical model may provide and/or take into account information of the measurement system itself. Put another way, statistical uncertainty of the measurement system itself can be removed due to the statistical model. Hence, only the statistical properties of the combined measurement results can be separated and processed solely. Accordingly, the outputted information is based on a statistical analysis that is assigned to the statistical model applied.

An aspect provides that the processing module comprises an automation logic that is configured to stop the measurements once the live statistical significance parameter achieves a threshold of statistical significance. Hence, the measurements are stopped once the live statistical significance parameter achieves the threshold of statistical significance that was intended for the respective statistical significance parameter. The measurements are stopped once the criterion applied is fulfilled by the measurement results. The criterion may be assigned to a certain threshold value that is requested by the user for obtaining a statistically reliable information of the performance parameter measured. Accordingly, the overall measurement time can be reduced as the measurements are automatically stopped when the certain statistical significance meets the threshold.

The threshold of statistical significance may correspond to a threshold value set by the user, particularly via the user interface. For instance, the measurements are stopped as soon as a certain confidence interval on the combined measurement results, namely the estimated or rather measured output value, is smaller than the threshold of statistical significance that was set by the user.

Thus, the overall measurement time can be reduced as the measurements may be stopped once the certain statistical significance is reached that was desired by the user. Development times required for developing a certain device under test can be reduced as the measurement time is reduced which in turn results in lower costs.

As mentioned earlier, the time duration may be outputted so that the user of the measurement system is enabled to plan the measurement procedure required for achieving the certain statistical significance.

Moreover, the processing module may be configured to calculate statistical properties in a pre-configuration mode, the statistical properties being derived from modelling measurement results obtained from measurements conducted by the measurement module in the pre-configuration mode. Thus, statistical properties are calculated in a pre-configuration mode, the statistical properties being derived from modelling measurement results obtained from measurements conducted by the measurement module in the pre-configuration mode. The statistical properties may be assigned to the statistical model that is applied. It may be assumed that the statistical properties remain unchanged over time.

In fact, the statistical properties may, inter alia, be assigned to the measurement system. Thus, separation of the statistical significance parameters assigned to the device under test and the measurement system can be achieved due to the measurements conducted in the pre-configuration mode.

Particularly, the processing module comprises an automated hypothesis testing logic that is configured to verify whether the statistical properties change with respect to the data obtained in the pre-configuration mode. Hence, it is verified whether the statistical properties change with respect to the data obtained in the pre-configuration mode. Deviations with respect to the data obtained in the pre-configuration mode may relate to the device under test. Thus, a particular failure or rather a particular problem assigned to the device under test may occur that has to be investigated. Alternatively, the measurement configuration or rather the measurement system has to be adapted by the user.

The measurement system may be configured to alert a user provided that the automated hypothesis testing logic detects that the statistical properties have changed. Thus, a user is alerted provided that the automated hypothesis testing logic detects that the statistical properties have changed. The user may be alerted by the measurement system in an appropriate manner, for instance via the display. Thus, the user is enabled to verify the reason(s) for the deviations occurred and the user may probably fix any problem.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
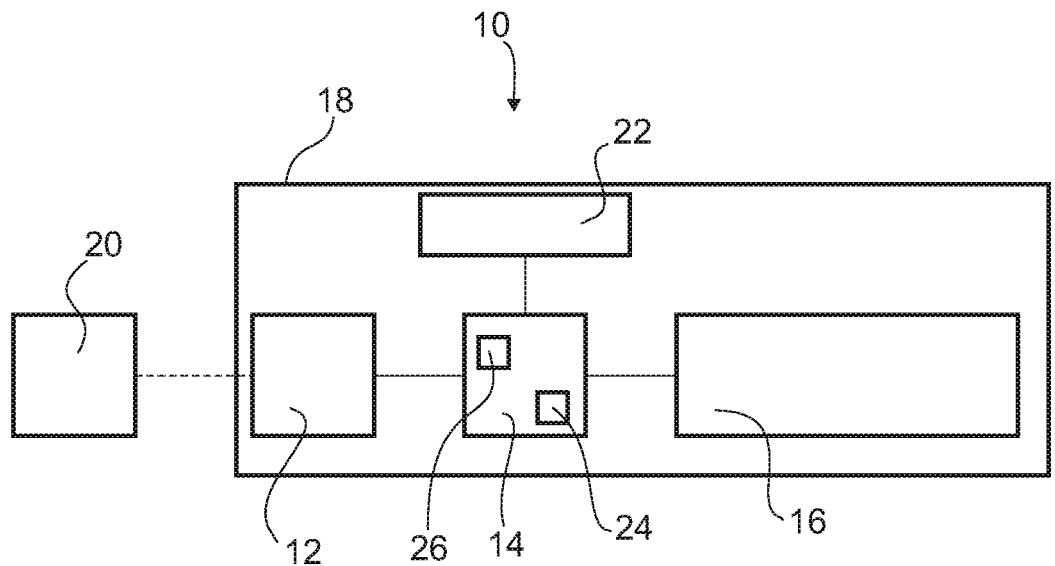
FIG. 1 schematically shows a measurement system according to the present disclosure.

In FIG. 1, a measurement system 10 is shown that comprises a measurement module 12, a processing module 14 as well as a display 16.

In the shown embodiment, the measurement system 10 is established in a unique manner which means that the measurement module 12, the processing module 14 as well as the display 16 are assigned to a common housing 18 of the measurement system 10. The housing 18 encompass the processing module 14 as well as the measurement module 12 at least partly whereas the display 16 is located at an outer wall of the housing 18.

The measurement system 10 is generally configured to conduct measurements on a device under test 20. For this purpose, the measurement module 12 interacts with the device under test 20, thus enabling to conduct measurements on the device under test 20, for instance via a cable connection or in a wireless manner.

The measurements are conducted in a repetitive manner obtaining measurement results that are assigned to the repeated measurements conducted.

The measurement results obtained by the measurement module 12 are forwarded to the processing module 14 that in turn combines or rather averages the measurement results obtained for processing purposes, in particular a statistical analysis.

Thus, the processing module 14 is configured to perform a statistical analysis in a live manner in order to calculate a live statistical significance parameter of the combined or rather averaged measurement results and/or a time duration required to obtain a certain statistical significance of the measurement results. In other words, the processing module 14 is configured to perform the respective statistical analysis while the measurements are conducted by the measurement module 12, namely in a live manner or rather in real time.

The live statistical significance parameter is assigned to the combined measurement results. Thus, the live statistical significance parameter may be standard deviation, statistical probability distribution and/or confidence interval whereas the combined or rather averaged measurement results correspond to a mean value of the measurement results. However, the combined or rather averaged measurement results may also correspond to the median of the measurement results obtained.

Furthermore, the time duration that is required to obtain the certain statistical significance may be calculated by the processing module 14 based on a statistical model that was obtained from measurements conducted in a pre-configuration mode.

In the pre-configuration mode, knowledge about the measurement system 10 itself was gathered that can be used to separate statistical significance parameters assigned to the measurement system 10 and the device under test 20. Thus, information with respect to the statistical significance parameter of the combined measurement results can be provided as the uncertainties assigned to the measurement system 10 were already removed.

The processing module 14 is further connected with the display 16 so that the output of the processing module 14 may be displayed on the display 16. In other words, the display 16 is configured to display the live statistical significance parameter and/or the time duration which are/is calculated by the processing module 14 previously.

In addition, the measurement module 12 may also be connected with the display 16 in a direct manner so that measurement results obtained by the measurement module 12 may be displayed directly, namely the current measurement value. Alternatively, the current measurement value is forwarded from the measurement module 12 to the display 16 via the processing module 14.

Hence, the display 16 is configured to display a measurement value obtained from a current measurement, namely a live measurement, that is conducted by the measurement module 12 at that time without any averaging or rather combining operation applied.

As mentioned earlier, the measurement module 12 conducts several measurements on the device under test 20 in a repetitive manner wherein the respective measurement results obtained are combined or rather averaged by the processing module 14 in order to gather the combined or rather average value of the measurement results that is also called measured output value.

Furthermore, the display 16 may simultaneously display the live statistical significance parameter calculated as well as the combined value of the measurement results, namely the measured output value.

Thus, the user gets informed about the statistical accuracy of the measured value, namely the average or rather combined value.

In addition, the measurement system 10 has a user interface 22 via which the user is enabled to make settings of the measurement system 10, in particular settings affecting the processing module 14. Generally, the user interface 22 may be provided by the display 16, particularly a touch-sensitive display.

For instance, the user is enabled to set the certain statistical significance and/or a configurable measurement parameter via the user interface 22. The certain statistical significance may correspond to a 99% confidence interval that is desired by the user. Hence, the user is enabled to set the confidence level to the respective value desired via the user interface 22.

Alternatively or additionally, the user may set a configurable measurement parameter such as a desired measurement time that is assigned to the period of time provided for an averaging operation or rather a combining operation. Thus, the certain statistical significance may be set indirectly since the user sets the measurement time.

As already mentioned above, the processing module 14 as well as the display 16 are operated in real-time.

Thus, the live statistical significance parameter and/or the time duration may be calculated and/or displayed while the measurements are conducted by the measurement module 12. Hence, the user is continuously informed about the expected remaining measurement time that is required to achieve the level of statistical accuracy set by the user while setting the certain statistical significance, for instance the level of statistical significance.

Moreover, the user is informed about the current statistical significance achieved by the current measurements since the statistical significance parameter of the combined measurement results is calculated and displayed in real time.

The processing module 14 comprises an automation logic 24 that is configured to stop the measurements once the live statistical significance parameter achieves a threshold value assigned to the certain statistical significance. In other words, the measurements are stopped as soon as the threshold set by the user via the user interface 22 is reached.

Therefore, the live statistical significance parameter calculated by the processing module 14 is continuously compared with the threshold set by the user. For instance, a level of statistical significance was set as the threshold value.

In addition, the processing module 14 is generally configured to calculate statistical properties in a pre-configuration mode of the measurement system 10.

In fact, the statistical properties are derived from modelling measurement results obtained by measurements conducted in the pre-configuration mode. In the pre-configuration mode, a certain level of statistical accuracy is achieved based on pre-measurements which in turn are used to model the statistical properties.

The respective statistical properties modeled are then used for all subsequent measurements based on the assumption that the statistical distribution does not change over time.

Hence, statistical properties assigned solely to the measurement system 10 may be obtained in the pre-configuration mode which can be used later to separate statistical significance parameters assigned to the measurement system 10 and the device under test 20.

For verifying the assumption, the processing module 14 may comprise an automated hypothesis testing logic 26 that is configured to verify whether the statistical properties change with respect to the data obtained in the pre-configuration mode.

In other words, the automated hypothesis testing logic 26 compares the data obtained during the measurements with the data obtained in the pre-configuration mode in order to verify if any deviation of the statistical properties modeled occurs.

Should the measurement system 10 detect that the statistical properties have changed over time, an alert is outputted by the measurement system 10 in order to inform the user. The alert may be outputted via the display 16.

Thus, the user is informed about the deviation so that the measurement configuration should be checked. Alternatively or additionally, the device under test 20 might have a problem that causes the deviation.

In general, the measurement system 10 provides information with respect to a statistical significance of the measurements conducted on the device under test 20 so that the user is enabled to verify whether the measured output value, namely the combined or rather averaged result, is statistically accurate.

Figure 2:
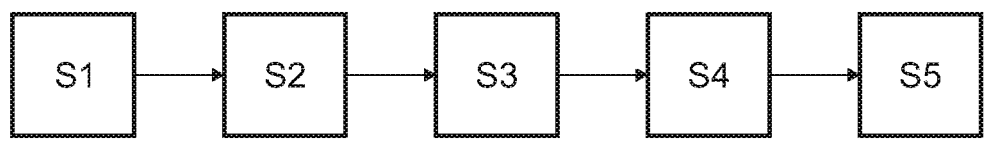
FIG. 2 shows a flow-chart illustrating a method according to the present disclosure.

In FIG. 2, a method of providing the statistical information to the user of the measurement system 10 is shown.

In a first step S1, measurements on the device under test 20 are conducted in a repetitive manner in order to obtain measurement results that are assigned to the repeated measurements.

In a second step S2, the measurements results obtained are combined or rather averaged in order to obtain a measured value or rather an averaged/combined result.

In a third step, a statistical analysis is performed in a live manner. The statistical analysis is performed on the measurement results, in particular the averaged/combined result.

In a fourth step S4, a live statistical significance parameter of the combined measurement results and/or a time duration required to obtain a certain statistical significance of the measurement results are/is calculated. The live statistical significance parameter to be calculated may be set by the user via the user interface 22. Moreover, the user may select via the user interface 22 that the time duration shall be calculated.

In a fifth step S5, the live statistical significance parameter and/or the time duration are/is displayed on the display 16.

Again, the user may select which of the information is displayed. Put another way, the user is enabled to decide which statistical information shall be displayed as he might be interested only in a certain statistical information.

Accordingly, the user of the measurement system 10 is informed via the display 16 with respect to the statistical significance since the live statistical significance parameter or rather the time duration required to obtain the desired level of statistical significance of the measurement results is outputted.

The live statistical significance parameter and/or the time duration are/is calculated/displayed while the measurements are done, namely in a live manner or rather in real time.

Prior to the measurements, statistical properties are calculated that were derived from modelling measurement results obtained by measurements conducted in the pre-configuration mode.

Later, the respective statistical properties are used to verify whether the statistical properties change with respect to the data obtained in the pre-configuration mode. If the measurement device 10 detects a deviation, an alert may be outputted to inform the user appropriately. In fact, it is assumed that the statistical influence of the measurement system 10 is stable and, therefore, it remains constant over time.

In case of an occurring deviation, the user gets informed in order to check the device under test 20 or rather the measurement system 10.

Furthermore, the measurements may be stopped automatically once the live statistical significance parameter achieves a threshold of statistical significance. The threshold may also be set by the user itself. For instance, the threshold may correspond to a certain level of confidence that was set by the user previously. Hence, the overall measurement time can be reduced significantly as the measurements are stopped immediately the level of confidence was reached.

Moreover, the level of confidence only relates to the statistical significance of the measurement results since the statistical significance assigned to the measurement system 10 itself was already separated previously.

In addition, the user may set a configurable measurement parameter, for instance the measurement time. Then, the live statistical significance parameter provides information with regard to the statistical accuracy of the measurements conducted in the pre-defined measurement time. For instance, it is displayed to inform the user that in the time period given a respective level of confidence was reached.

As already described, any module described herein may be established by software modules so that a computer program is provided that may be used by the measurement module 12 and/or the processing module 14. The computer program has a program code adapted to cause the measurement module 12 and/or the processing module 14 to perform the steps mentioned above when the computer program is run on the measurement module 12 and/or the processing module 14. Alternatively, the modules may be established by hardware circuitry, or combination of software and hardware circuitry.

It will then be appreciated that one or more aspects of the methods set forth herein can be carried out in a computer system. In this regard, a program element is provided, which is configured and arranged when executed on a computer to recover a clock signal from a data signal. In one embodiment, the program element may specifically be configured to perform the steps of: combining the measurement results obtained and performing a statistical analysis in a live manner in order to calculate at least one of a live statistical significance parameter of the combined measurement results and a time duration required to obtain a certain statistical significance of the measurement results. In other embodiments, the program element may be specifically configured to perform the steps of Claims 13-18.

The program element may be installed in memory, such as computer readable storage medium. The computer readable storage medium may be any one of the computing devices, modules, instruments, analyzers, post processing units, etc., described elsewhere herein or another and separate computing device, modules, instruments, analyzers, post processing unit, etc., as may be desirable. The computer readable storage medium and the program element, which may comprise computer-readable program code portions embodied therein, may further be contained within a non-transitory computer program product.

As mentioned, various embodiments of the present disclosure may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, optical disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Other non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM) of any rate, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

The computer-readable media include cooperating or interconnected computer-readable media, which exist exclusively on a processing system or distributed among multiple interconnected processing systems that may be local to, or remote from, the processing system.

As should be appreciated, various embodiments of the present disclosure may be also implemented as methods, apparatus, systems, computing devices, computing entities, and/or the like, as have been described elsewhere herein or claimed below. As such, embodiments of the present disclosure may take the form of an apparatus, system, computing device, computing entity, and/or the like executing instructions stored on a computer-readable storage medium to perform certain steps or operations. However, embodiments of the present disclosure may also take the form of an entirely hardware embodiment performing certain steps or operations.

Various embodiments are described above with reference to block diagrams and/or flowchart illustrations of apparatuses, methods, systems, and computer program products. It should be understood that each block of any of the block diagrams and/or flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks and/or carry out the methods described herein.

These computer program instructions may also be stored in a computer-readable memory, such as the computer-readable storage media described above, that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, could be implemented by special purpose hardware-based computer systems or circuits, etc., that perform the specified functions or operations, or combinations of special purpose hardware and computer instructions.

According to some embodiments, many individual steps of a process may or may not be carried out utilizing the computer systems described herein, and the degree of computer implementation may vary, as may be desirable and/or beneficial for one or more particular applications.

It should now be appreciated that some embodiments of the present disclosure, or portions thereof, have been described in the general context of computer code or machine-useable instructions, including computer-executable instructions such as program modules, being executed by a computing system, or other machine or machines. Some of these embodiments or others may be implemented using a variety of system configurations, including handheld devices, consumer electronics, general-purpose computers, more specialty computing devices, etc. Embodiments described herein may also be implemented in distributed computing environments, using remote-processing devices that are linked through a communications network or the Internet.

For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system comprising a measurement module, a processing module, and a display,
   the measurement module being configured to conduct measurements on a device under test in a repetitive manner in order to obtain measurement results assigned to the repeated measurements,
   the processing circuit being configured to combine the measurement results obtained, thereby gathering a combined value of the measurement results assigned to the repeated measurements, the processing circuit being further configured to perform a statistical analysis in a live manner in order to calculate at least one of a live statistical significance parameter of the combined measurement results and a time duration required to obtain a certain statistical significance of the measurement results,
   wherein the live statistical significance parameter is assigned to the measurement results obtained since statistical significance parameters are taken into account for the measurement system itself and the device under test, wherein the respective statistical significance parameters are separated from each other in order to obtain the at least one live statistical significance parameter of the combined measurement results, and
   the display being configured to display at least one of the live statistical significance parameter and the time duration.

2. The measurement system according to claim 1, wherein the measurement system comprises a user interface via which a user is enabled to make settings of the measurement system.

3. The measurement system according to claim 2, wherein the user interface is configured to enable the user to set at least one of the certain statistical significance and a configurable measurement parameter.

4. The measurement system according to claim 1, wherein the processing circuit is configured to calculate at least one of the live statistical significance parameter and the time duration while the measurements are conducted.

5. The measurement system according to claim 1, wherein the display is configured to display at least one of the live statistical significance parameter and the time duration while the measurements are conducted.

6. The measurement system according to claim 1, wherein the display is configured to simultaneously display the live statistical significance parameter and a combined value of the measurement results.

7. The measurement system according to claim 1, wherein the display is configured to display a measurement value obtained from the current measurement conducted by the measurement module.

8. The measurement system according to claim 1, wherein the processing circuit is configured to apply a statistical model for calculating at least one of the live statistical significance parameter and the time duration.

9. The measurement system according to claim 1, wherein the processing circuit comprises an automation logic that is configured to stop the measurements once the live statistical significance parameter achieves a threshold of statistical significance.

10. The measurement system according to claim 1, wherein the processing circuit is configured to calculate statistical properties in a pre-configuration mode, the statistical properties being derived from modelling measurement results obtained from measurements conducted by the measurement module in the pre-configuration mode.

11. The measurement system according to claim 10, wherein the processing circuit comprises an automated hypothesis testing logic that is configured to verify whether the statistical properties change with respect to the data obtained in the pre-configuration mode.

12. The measurement system according to claim 11, wherein the measurement system is configured to alert a user provided that the automated hypothesis testing logic detects that the statistical properties have changed.

13. A method of providing statistical information to a user of a measurement system, the method comprising the steps of:
   conducting measurements on a device under test in a repetitive manner in order to obtain measurement results assigned to the repeated measurements;
   combining the measurement results obtained;
   performing a statistical analysis in a live manner;
   computing at least one of a live statistical significance parameter of the combined measurement results and a time duration required to obtain a certain statistical significance of the measurement results; and
   displaying at least one of the live statistical significance parameter and the time duration,
   wherein statistical properties are calculated in a pre-configuration mode, the statistical properties being derived from modelling measurement results obtained from measurements conducted by the measurement module in the pre-configuration mode, and
   wherein it is verified whether the statistical properties change with respect to the data obtained in the pre-configuration mode.

14. The method according to claim 13, wherein a user sets at least one of the certain statistical significance and a configurable measurement parameter.

15. The method according to claim 13, wherein at least one of the live statistical significance parameter and the time duration is at least one of calculated and displayed while the measurements are conducted.

16. The method according to claim 13, wherein a statistical model of data obtained from the measurements conducted is applied for calculating the time duration required to obtain the certain statistical significance.

17. The method according to claim 13, wherein the measurements are stopped once the live statistical significance parameter achieves a threshold of statistical significance.

18. The method according to claim 13, wherein a user is alerted provided that the automated hypothesis testing logic detects that the statistical properties have changed.

19. A method of providing statistical information to a user of a measurement system, the method comprising:
- conducting measurements on a device under test in a repetitive manner in order to obtain measurement results assigned to the repeated measurements;
- combining the measurement results obtained, thereby gathering a combined value of the measurement results assigned to the repeated measurements;
- performing a statistical analysis in a live manner;
- computing at least one of a live statistical significance parameter of the combined measurement results and a time duration required to obtain a certain statistical significance of the measurement results, wherein the live statistical significance parameter is assigned to the measurement results obtained since statistical significance parameters are taken into account for the measurement system itself and the device under test, wherein the respective statistical significance parameters are separated from each other in order to obtain the at least one live statistical significance parameter of the combined measurement results; and
- displaying at least one of the live statistical significance parameter and the time duration.

* * * * *